United States Patent [19]

Yasunaga

[11] Patent Number: 4,636,772
[45] Date of Patent: Jan. 13, 1987

[54] MULTIPLE FUNCTION TYPE D/A CONVERTER

[75] Inventor: Soichiro Yasunaga, Kawasaki, Japan

[73] Assignee: Riken Denshi Co. Ltd., Kawasaki, Japan

[21] Appl. No.: 737,022

[22] Filed: May 22, 1985

[30] Foreign Application Priority Data

Jan. 17, 1985 [JP] Japan .................................... 60-4961

[51] Int. Cl.$^4$ ........................................... H03K 13/02
[52] U.S. Cl. ............................................. 340/347 DA
[58] Field of Search ................. 340/347 DA, 347 CC, 340/347 AD, 347 M; 364/607, 718

[56] References Cited

U.S. PATENT DOCUMENTS 4,381,499 4/1983 Struthoff ...................... 340/347 DA Primary Examiner—T. J. Sloyan
Attorney, Agent, or Firm—William J. Daniel

[57] ABSTRACT

A multiple function type D/A converter utilizing a ladder type resistance circuit, and capable of other mathematical functions in addition to the D/A conversion, having a series resistance circuit consisting of N number of resistors $R2_1 \sim R2_n$ each having a resistance value R connected in series between an output terminal $V_o$ and one side of a terminal resistor $R_o$ which has a resistance value 2R and is connected on its other side to ground, such series circuit including a resistor connecting point between each adjacent pair of resistors $R_0$, $R2_1 \sim R2_N$, and branching in parallel therefrom $N+1$ number of groups of parallel resistors $01 \sim 0n$, $11 \sim 1n$, . . . $N1 \sim Nn$, each containing n resistors where n is an integer greater than 1, the n resistors of each such group being all connected on one side to the same resistor connecting point with different groups thereof connected to different connecting points along such series circuit, the n resistors of each such group being individually switchable on the other side thereof alternately between ground and a reference voltage $V_s$ by means of corresponding groups of switching circuits $S_{01} \sim S_{0n}$ . . . $S_{N1} \sim S_{Nn}$ under the control of applied digital signals.

1 Claim, 8 Drawing Figures

REFERENCE SIGNAL.

INPUT SIGNAL

PRIOR ART

MULTIPLE FUNCTION TYPE D/A CONVERTER

FIELD OF THE INVENTION

The present invention relates to a multi-function type D/A converter using a resistance circuit and which is capable of executing a variety of mathematical functions while converting an input digital signal, based on the natural binary code, into an analog signal having a voltage level corresponding to such digital value.

BACKGROUND OF THE INVENTION

FIG. 8 shows a typical known circuit of this type for D/A conversion, consisting of a so-called "R-2R ladder" type circuit or network wherein a set of resistors $R1_0 \sim R1_N$ each having a resistance value of 2R equal in number to the number N plus 1 (N+1) are each connected in parallel with a terminating resistor $R_0$ which has a resistance value 2R and is connected to ground along a series of series resistors $R2_1 \sim R2_N$ having a resistance value R, and ending in an output terminal $V_0$, the individual parallel resistors being connected by switching circuits $S_0 \sim S_N$ alternately between a source of reference voltage $V_s$ and ground, such switching circuits being controlled by digital signals $b_0 \sim b_N$. As is obvious, when the digital signals $b_0 \sim b_N$ of each digit become high ("On"), the reference voltage $V_s$ is applied to the corresponding parallel resistors $R1_0 \sim R1_N$. Accordingly, an analog output voltage $V_0$ is generated at the output terminal according to the following equation (1):

$$V_0 = (V_s/2) \times (b_0 \cdot 2^{-N} + b_1 \cdot 2^{-(N-1)} + \ldots + b_{N-1} \cdot 2^{-1} + b_N \cdot 2^0) \quad (1)$$

Where, $b_0 \sim b_N$ are 1 or 0, either high or low. The value of $V_0$ is lowered from the value indicated by the equation (1) when a terminating resistor or adjusting resistor is connected to the output terminal due to the resistance thereof.

Thus, the ladder type D/A converter operates as a D/A converter through the switching between ON and OFF of the parallel resistors $R1_0 \sim R1_N$ in accordance with the digital signals and therefore if a circuit capable of carrying out other mathematical functions required, e.g., such as addition and subtraction before or after the conversion, such circuit must be provided in addition to the D/A converter circuit.

SUMMARY OF THE INVENTION

It is therefore an object of the present invention to provide a multiple operation type D/A converter utilizing a ladder type resistance circuit which is capable of other mathematical functions in addition to the D/A conversion.

In order to attain such object, the present invention uses a circuit arranged as shown in FIG. 1, wherein a series resistance circuit consisting of N number of resistors $R2_1 \sim R2_n$ each having a resistance value R is connected between an output terminal $V_o$ and one side of a terminal resistor $R_o$ which has a resistance value 2R and is connected on its other side to ground, such series circuit including a resistor connecting point between each pair of resistors $R_o$, $R2_1 \sim R2_N$ has branching in parallel therefrom N+1 number of groups of parallel resistors $01 \sim 0n, 11 \sim 1n, \ldots N1 \sim Nn$, each group containing n resistors where n is an integer greater than 1, the n resistors of each such group being all connected on one side to the same resistor connecting point with different groups of resistors connected to different connecting points along such series circuit, the n resistors of each such group being individually connected on the other side alternately between ground and a reference voltage $V_s$ by means of corresponding groups of switching circuits $S_{01} \sim S_{0n} \ldots S_{N1} \sim S_{Nn}$ under the control of applied digital signals.

DETAILED DESCRIPTION OF THE INVENTION

Figure 1:
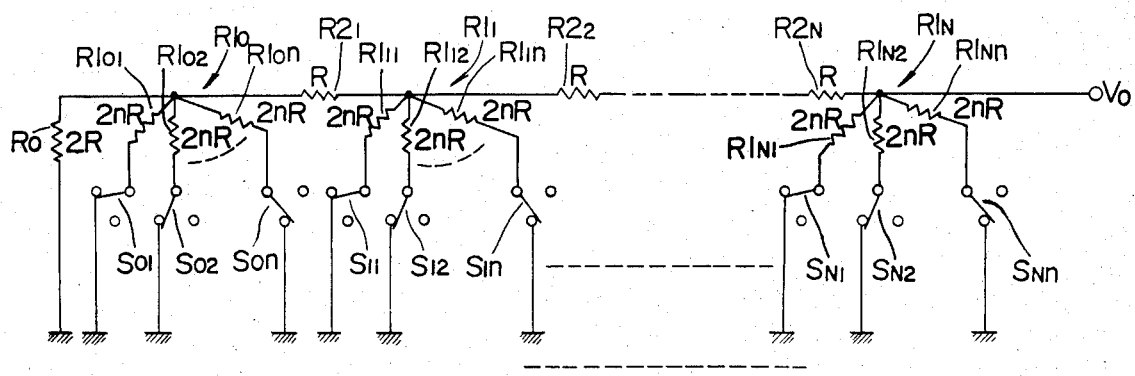
FIG. 1 is a general circuit diagram of a multiple function type D/A converter of the present invention. The connection of the respective switching contacts to the source of reference voltage $V_s$ being omitted.
Figure 2:
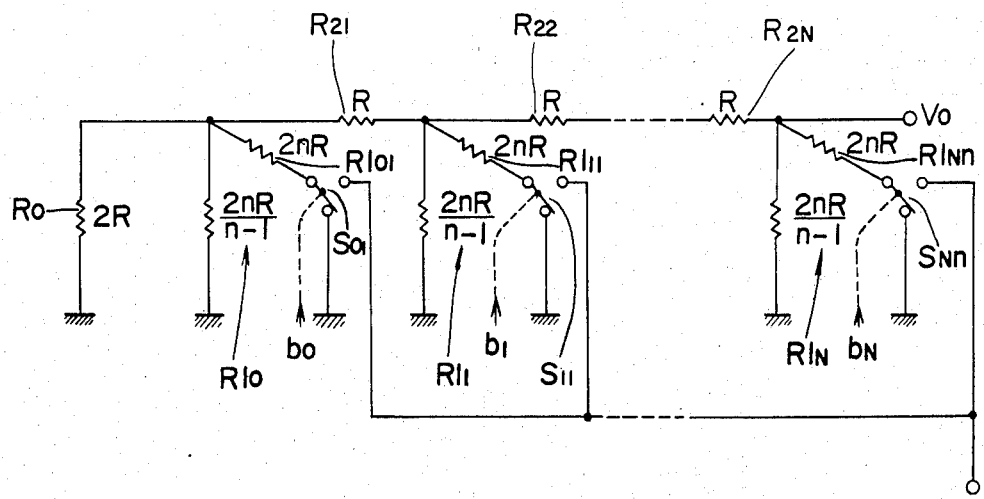
FIG. 2 to FIG. 5 show circuit diagrams illustrating the principles for carrying out functions other than the D/A conversion by utilizing the ladder type D/A converter circuit shown in FIG. 1.
Figure 8:
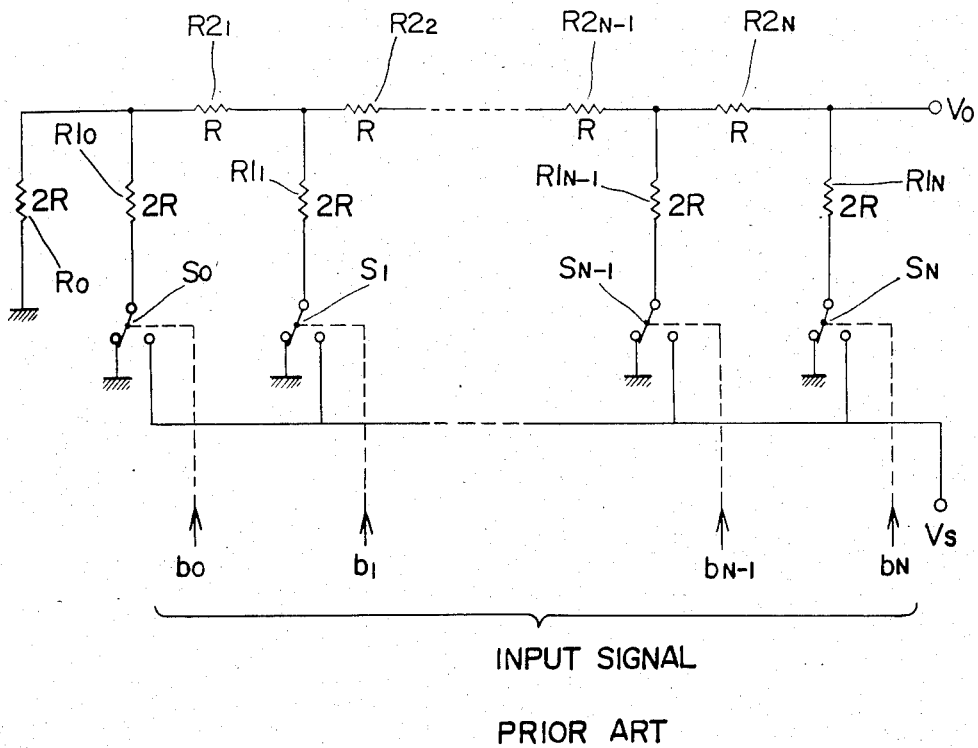
FIG. 8 shows a conventional ladder type D/A converter circuit of the prior art.

When the circuit of this invention is operated as an ordinary D/A converter, the switch circuits $S_{01} \sim S_{0n}, \ldots S_{N1} \sim S_{Nn}$ are respectively controlled by the common digital signal for each group or partly controlled by that signal (for example, the first switch of each group $S_{01} \sim S_{N1}$) with the remaining switching circuits of each group ($S_{02} \sim S_{0n} \ldots S_{N2} \sim S_{Nn}$) being otherwise controlled to connect all but one of the parallel n resistors of each group to the reference potential $V_s$ by setting the control signal for the latter at their low level ("OFF"). Thus, the total resistance value of each group of n resistors $R1_{01} R1_{0n}, \ldots R1_{N1} \sim R1_{Nn}$ becomes 2R and is connected to the reference voltage $V_s$ and therefore the circuit structure becomes equivalent to FIG. 8 and performs D/A conversion in accordance with equation (1). As other switching circuits of each n group are activated to bring additional n resistors (of resistance value 2nR) into the circuit with reference voltage $V_s$, the voltage of reference voltage source is correspondingly lowered in proportion to the number of such resistors, having resistance value 2nR, connected at the same time to the reference potential for each group. Thus, the D/A conversion is carried out and gives a correspondly lowered output signal voltage. For example, when only one switch circuit $S_{01} \sim S_{N1}$ is controlled in each digit, the circuit becomes equivalent to that shown in FIG. 2 and an output signal $V_0$ is expressed as indicated in equation (2) below, in place of the equation (1).

$$V_0 = (V_s/2n)(b_0 \cdot 2^{-N} + b_1 \cdot 2^{-(N-1)} + \ldots + b_N \cdot 2^0) \quad (2)$$

If the circuit is to be operated as an adder, the resistors $R1_0 \sim R1_N$ of each digit are activated according to the number of adding signals n and the associated switch circuits $S_{01} \sim S_{0n}, \ldots S_{N1} \sim S_{Nn}$ are controlled by the associated digital signals $b_{01} \sim b_{0n}, b_{N1} \sim b_{Nn}$ to be added. Thereby, the digital signals to be added are converted to analog signals and outputed additively to the output terminal.

Figure 3:
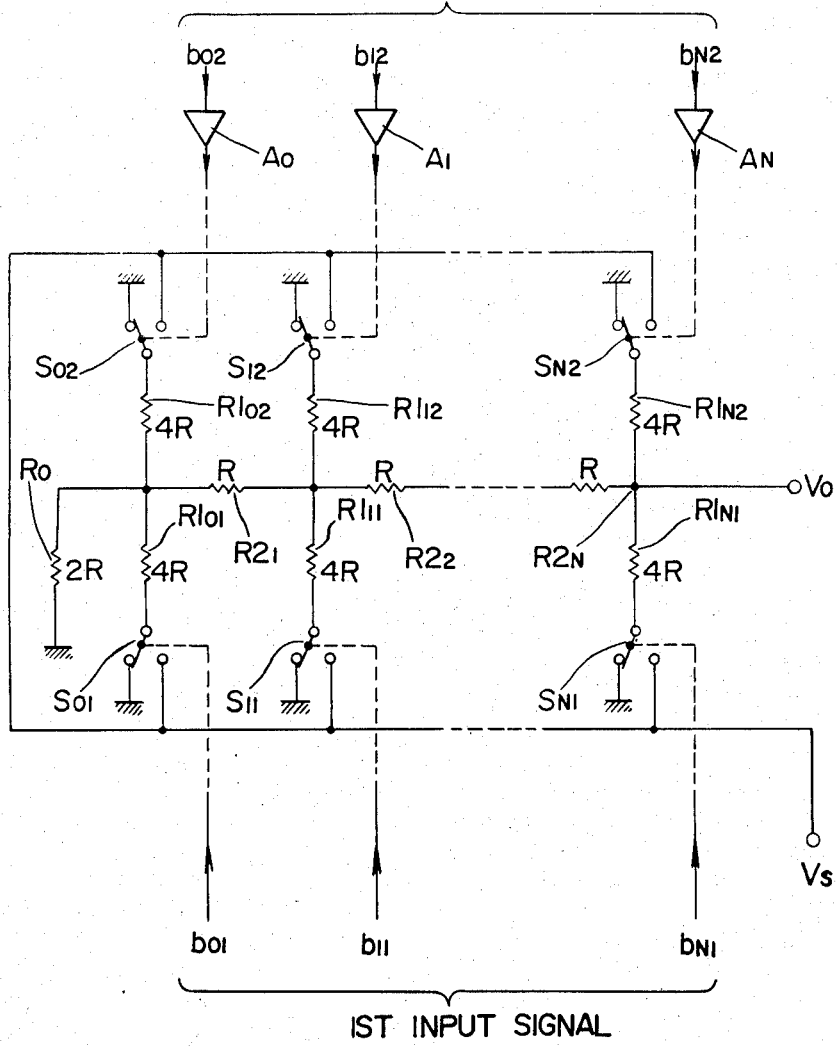

When the circuit is to be operated as a subtracter, the resistors $R1_0 \sim R1_N$ of each digit group are composed of the resistors in such number as the input signals and the digital signals of switches $S_0 \sim S_N$ corresponding to the signal to be subtracted or minus signal are supplied through inverters. Thereby, subtraction processing for the input signal not inverted is carried out. FIG. 3 is an example of a circuit for subtracting a second input signal from a first input signal. The inverters $A_0 \sim A_N$ are interposed in the control lines of switch circuits $S_{02} \sim S_{N2}$ for the second signal. Thereby, when both input signal values coincide, namely, when the result of subtraction is zero, the one is inverted and the added digital values all become "high". Accordingly, the output signal $V_0$ is generated so that the reference voltage $V_s$ is applied respectively to the one of the parallel resistor pairs $R1_{01}$, $R1_{02}$, $R1_{11}$, $R1_{12}$; ... ; $R1_{NL}$, $R1_{N2}$ of each digit group. Thus, the output $V_0$ is expressed as follows from the equation (2).

$$V_0 = (V_s/4)(b_0 \cdot 2^{-N} + b_1 \cdot 2^{-(N-1)} + \ldots + b_N \cdot 2^0) \quad (3)$$

Therefore, the voltage of output signal $V_0$ increases or decreases in accordance with the result of subtraction, even shifting the polarity (+, −) with reference to the voltage, as defined by the equation (3) which applies when the result of subtraction is zero.

Where the circuit is to be operated as a coincidence detection circuit for two digital signals, detection occurs in the same way that the output signal $V_0$ is generated or not when values of $b_0 \sim b_N$ of equation (3) are all "high" in FIG. 3.

Figure 4:
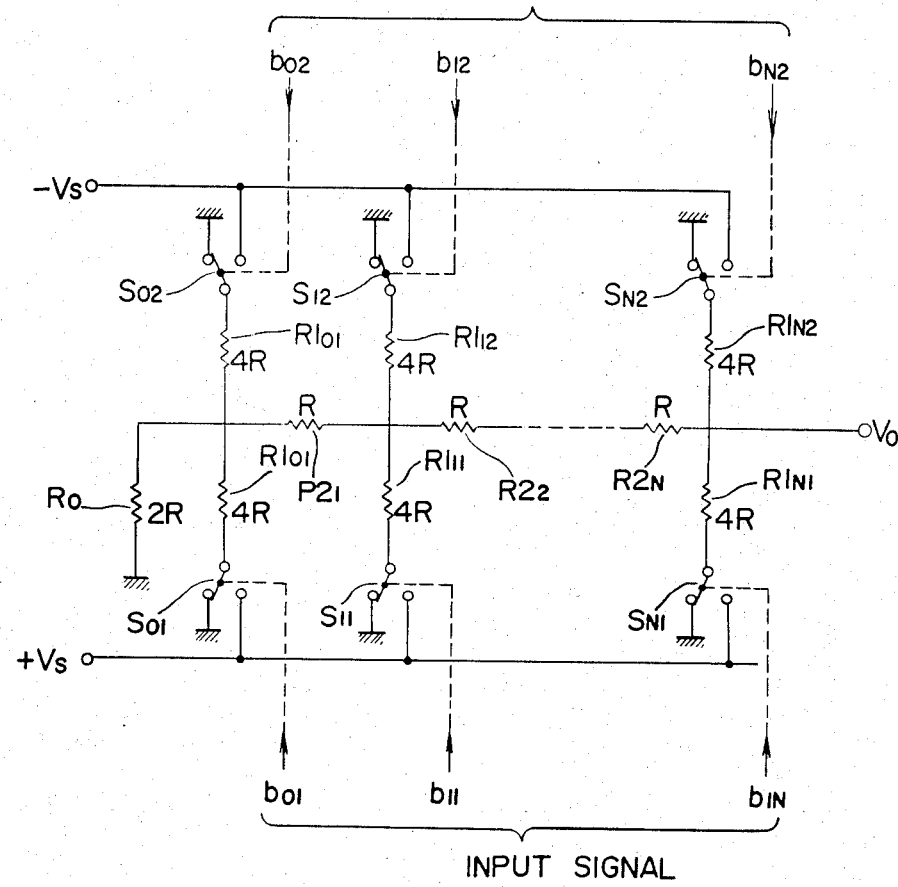
Figure 5:
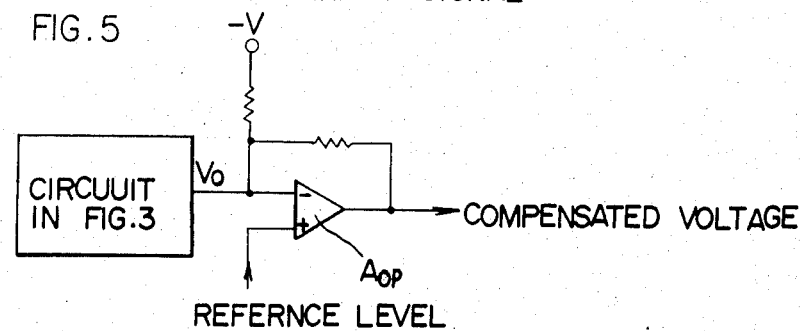

For the circuit to be operated for compensating voltage, two resistors in each digit group are used as the parallel resistors $R1_0 \sim R1_N$ as shown in FIG. 4, e.g., $R1_{01} \sim R1_{N1}$ and $R1_{02} \sim R1_{N2}$, and these groups of resistors, i.e., the "1" group and the "2" group are connected to different reference voltage sources set to the voltage of equal but opposite polarity such as $+V_s$ and $-V_s$. Thereby, the output signal $V_0$ becomes the compensation voltage for the reference voltage and when the reference signal coincides with the input signal, the output voltage $V_0$ becomes zero. The circuit is thus operated as the subtractor which generates a negative voltage for a negative subtraction result. Moreover, as shown in FIG. 5, it is also possible to connect the output terminal of the subtraction circuit of FIG. 3 to a succeeding stage utilizing an operational amplifier $A_{op}$ having a reference level which is equal to the voltage obtained when values of $b_0 \sim b_N$ of equation (3) are all set to "1". When the input signal coincides with the reference signal, an output of the operational amplifier $A_{op}$ becomes zero.

Figure 6:
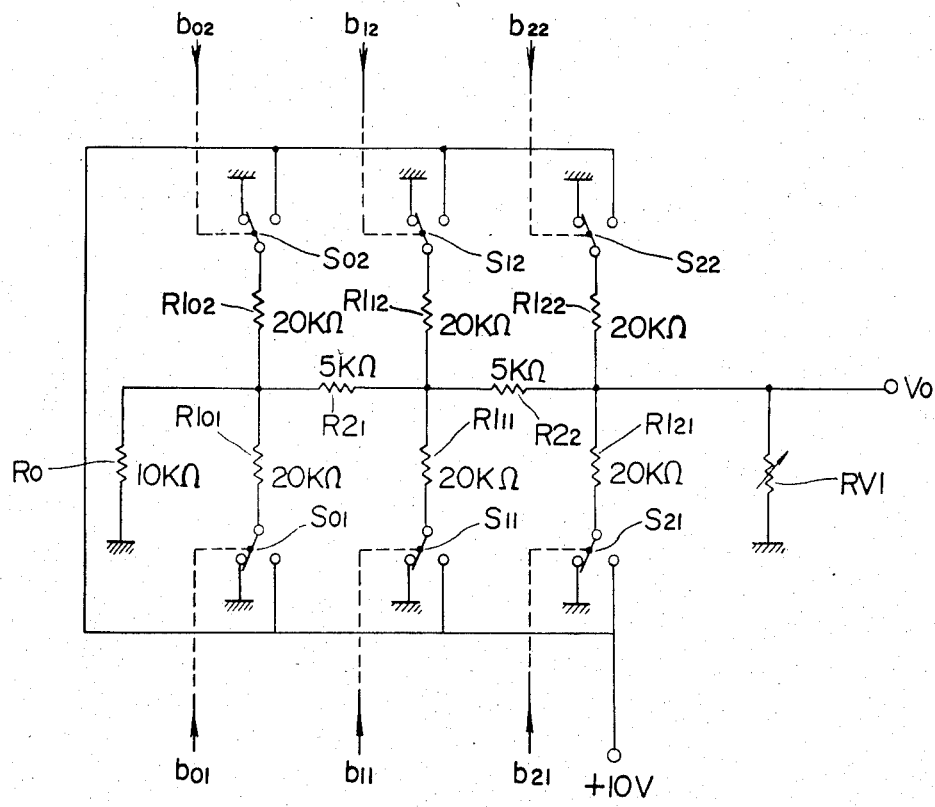
FIG. 6 and FIG. 7 show circuit diagrams of other embodiments of the present invention.

FIG. 6 shows a 3-bit 2-input type multiple-function type D/A converter, wherein the reference voltage $V_s$, common to all inputs, is set to +10 V and a variable resistor RV1 for adjusting output voltage is connected to the output terminal.

If the converter of FIG. 6 is operated as in the addition mode, an output signal $V_0$ is obtained at the output terminal according to equation (3), but modified by a coefficient $K$ ($1 \sim 0$) preset by the variable resistor RV1, by respectively controlling the switch circuits $S_{01} \sim S_{21}$ and $S_{02} \sim S_{22}$, with two digital signals $b_{01} \sim b_{21}$ and $b_{02} \sim b_{22}$, the modified equation being as follows:

$$V_0 = K(5/2)(b_{01} + b_{02}) \cdot 2^{-2} + (b_{11} + b_{12}) \cdot 2^{-1} + (b_{21} + b_{22}) \cdot 2^0 \quad (4)$$

Thus, when both digital signals are "high" the maximum output voltage $V_0$ is equal to $K \times (35/4)$ volts.

For the circuit to be operated in the concidence mode or subtraction mode, one set of digital signals $b_{02}$, $b_{12}$, $b_{22}$ are respectively supplied to the switch circuits $S_{02} \sim S_{22}$ through inverters similar to those shown in FIG. 4. Accordingly, when both sets of digital signals coincide, an output signal $V_0 = K \times (35/8)$ volts is generated from the equation (4) as explained above. Thereby, not only is coincidence detected but also any difference between the output signal $V_0$ and the reference voltage is obtained as a result of analogous subtraction.

Figure 7:
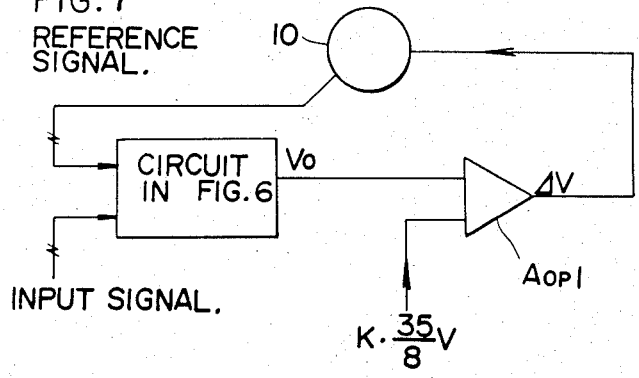

When the circuit is operated as a compensating circuit, as shown in FIG. 7, an operational amplifier $A_{op1}$ generates a voltage difference $\Delta V$ between the reference voltage $K(35/8)$ obtained from the equation (4) mentioned above and the output signal $V_0$ shown in FIG. 6. Therefore, the circuit is so controlled that the reference signal coincides with the input signal, making zero the voltage difference $\Delta V$ through the feedback of voltage difference $\Delta V$ to the control circuit 10.

According to the multiple function or mode type D/A converter of the present invention, the parallel resistors of the conventional ladder type resistance circuit are each composed of several resistors, and this modified circuit can be operated to simultaneously carry out a D/A conversion as well as any of a variety of other functions, such as addition, subtraction, compensation, balance or coincidence detection, etc., by controlling the respective resistors to the "low" or "high" levels with the digital signals. Further, additional stages of the circuit can be provided more simply and economically than by adding entire extra circuits for these respective functions.

Particularly, when used for coincidence detection, this circuit only requires accurately fixing the values of the resistance elements arranged face to face and accuracy will be remarkably improved as compared with the use of a plurality of ordinary ladder type D/A converters for this purpose.

What is claimed is:

1. A multiple function type D/A converter comprising a terminating resistor having a resistance value 2R of which one terminal is connected to ground; a series resistance circuit consisting of a plurality of resistors equal in number to N, each having a resistance value R, connected in series between an output voltage terminal and the other terminal of said terminating resistor, said series circuit including N+1 number of resistor connecting points between each adjacent pair of N resistors and the terminating resistor and the adjacent N resistor; branching in parallel from said series circuit N+1 number of groups of n number of parallel resistors, each having a resistance value 2nR, the n resistors of each such group being all connected on one side to the same resistor connecting point with different groups thereof connected to different connecting points along such series circuit, the n resistors of each such group being individually switchable on the other side alternately between ground and a reference voltage by means of corresponding groups of switching circuits under the control of applied digital signals, N and n each being an integer at least equal to 2.

* * * * *